United States Patent
Kim

(10) Patent No.: US 10,783,974 B2
(45) Date of Patent: Sep. 22, 2020

(54) VERIFICATION OF AN EXCESSIVELY HIGH THRESHOLD VOLTAGE IN A MEMORY DEVICE

(71) Applicant: SK hynix Inc., Gyeonggi-do (KR)

(72) Inventor: Sang-Sik Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/225,253

(22) Filed: Dec. 19, 2018

(65) Prior Publication Data
US 2019/0371418 A1  Dec. 5, 2019

(30) Foreign Application Priority Data

May 31, 2018  (KR) .................. 10-2018-0062298

(51) Int. Cl.
| | | |
|---|---|---|
| G11C 16/34 | (2006.01) | |
| G11C 16/10 | (2006.01) | |
| G11C 11/56 | (2006.01) | |
| G11C 16/04 | (2006.01) | |
| G11C 29/44 | (2006.01) | |
| G11C 29/50 | (2006.01) | |

(52) U.S. Cl.
CPC ...... G11C 16/3459 (2013.01); G11C 11/5628 (2013.01); G11C 16/0483 (2013.01); G11C 16/10 (2013.01); G11C 16/3463 (2013.01); G11C 16/3495 (2013.01); G11C 29/44 (2013.01); G11C 2029/5004 (2013.01); G11C 2211/5621 (2013.01)

(58) Field of Classification Search
None
See application file for complete search history.

(56) References Cited

U.S. PATENT DOCUMENTS

| | | | | |
|---|---|---|---|---|
| 9,460,799 | B1 * | 10/2016 | Costa | G11C 16/16 |
| 2005/0024939 | A1 * | 2/2005 | Chen | G11C 11/5628 |
| | | | | 365/185.17 |
| 2005/0024943 | A1 * | 2/2005 | Chen | G11C 16/3404 |
| | | | | 365/185.22 |
| 2011/0216592 | A1 * | 9/2011 | Nagashima | G11C 16/04 |
| | | | | 365/185.11 |
| 2013/0114342 | A1 * | 5/2013 | Sakai | G11C 29/025 |
| | | | | 365/185.17 |
| 2013/0114344 | A1 * | 5/2013 | Sakai | G11C 11/5628 |
| | | | | 365/185.18 |

FOREIGN PATENT DOCUMENTS

| | | |
|---|---|---|
| KR | 1020140063146 | 5/2014 |
| KR | 1020160116913 | 10/2016 |
| KR | 1020170011324 | 2/2017 |

* cited by examiner

*Primary Examiner* — J. H. Hur
(74) *Attorney, Agent, or Firm* — IP & T Group LLP

(57) ABSTRACT

A memory device may include: a control circuit comprising a first verification component suitable for counting the number of memory cells in the selected word line having an excessively high threshold voltage as excessive memory cells, after a program operation is completed; and a second verification component suitable for counting the number of failed bits when the number of excessive memory cells counted is greater than or equal to an excess threshold value, and suitable for outputting a pass or fail signal for the program operation according to the count of at least one of the first verification component and the second verification component.

20 Claims, 12 Drawing Sheets

VERIFICATION OF AN EXCESSIVELY HIGH THRESHOLD VOLTAGE IN A MEMORY DEVICE

CROSS-REFERENCE TO RELATED APPLICATION

The present application claims priority under 35 U.S.C. § 119(a) to Korean Patent Application No. 10-2018-0062298, filed on May 31, 2018, the disclosure of which is incorporated herein by reference in its entirety.

BACKGROUND

1. Field

Various embodiments of the present invention relate to a memory device and a memory system. Particularly, embodiments relate to a memory device capable of efficiently verifying a program operation, and an operating method thereof and a memory system including the memory device.

2. Description of the Related Art

The computer environment paradigm has moved towards ubiquitous computing, which enables computing systems to be used anytime and anywhere. As a result, the demand for portable electronic devices, such as mobile phones, digital cameras, and laptop computers have increased rapidly. Those electronic devices generally include a memory system using a memory device as a data storage device. The data storage device may be used as a main memory unit or an auxiliary memory unit of a portable electronic device.

Since there is no mechanical driving part, such a data storage device provides advantages such as excellent stability and durability, high information access speed, and low power consumption. Also, the data storage device can have a quick data access rate with low power consumption relative to a hard disk device. Examples of data storage devices having such advantages include universal serial bus (USB) memory devices, memory cards of diverse interfaces, solid-state drives (SSDs), and the like.

SUMMARY

Various embodiments of the present invention are directed to a memory device and a memory system capable of efficiently verifying a program operation.

In accordance with an embodiment of the present invention, a memory device may include: a memory cell array comprising a plurality of memory cells; an address decoder suitable for selecting a word line to which target data are to be programmed based on a write command; a read/write circuit comprising a plurality of page buffers, and suitable for performing a program operation of programming the target data to the selected word line; and a control circuit comprising a first verification component suitable for counting the number of memory cells in the selected word line having an excessively high threshold voltage as excessive memory cells, after the program operation is completed; and a second verification component suitable for counting the number of failed bits when the number of excessive memory cells counted is greater than or equal to an excess threshold value, and suitable for outputting a pass or fail signal for the program operation according to the count of at least one of the first verification component and the second verification component.

In accordance with an embodiment of the present invention, an operating method of a memory device may include: selecting a word line to which target data are to be programmed based on a write command; programming the target data to the selected word line; performing a first verify operation comprising counting the number of memory cells having an excessively high threshold voltage in the selected word line as excessive memory cells, after the programming of the target data; performing a second verify operation comprising counting the number of failed bits, when the result of the first verify operation indicates that the number of excessive memory cells is greater than or equal to an excess threshold value; and outputting a pass or fail signal for the program operation, according to the result of at least one of the first verify operation and the second verify operation.

In accordance with an embodiment of the present invention, a memory system may include a memory device; and a controller suitable for providing a write command, target data corresponding to the write command, and an address corresponding to the target data to the memory device, wherein the memory device comprises: a memory cell array comprising a plurality of memory cells; an address decoder suitable for selecting a word line to which the target data are to be programmed; a read/write circuit comprising a plurality of page buffers, and suitable for programming the target data to the selected word line; and a control circuit suitable for counting the number of memory cells having an excessively high threshold voltage (excessive memory cells) in the selected word line after the program operation is completed, counting the number of failed bits when the number of excessive memory cells counted is greater than or equal to an excess threshold value, and outputting a pass or fail signal for the program operation to the controller according to at least one of the number of excessive memory cells counted and the number of failed bits counted.

In accordance with an embodiment of the present invention, a memory system may include a memory device including a plurality of memory cells; a controller suitable for providing the memory device with target data and an address for programming, wherein the memory device is suitable for: selecting memory cells, among the plurality of memory cells, based on the address; programming the target data to the selected memory cells; determining the number of memory cells having an excessively high threshold voltage as excessive memory cells among the selected memory cells; and generating a result signal for the program operation based on the number of excessive memory cells.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
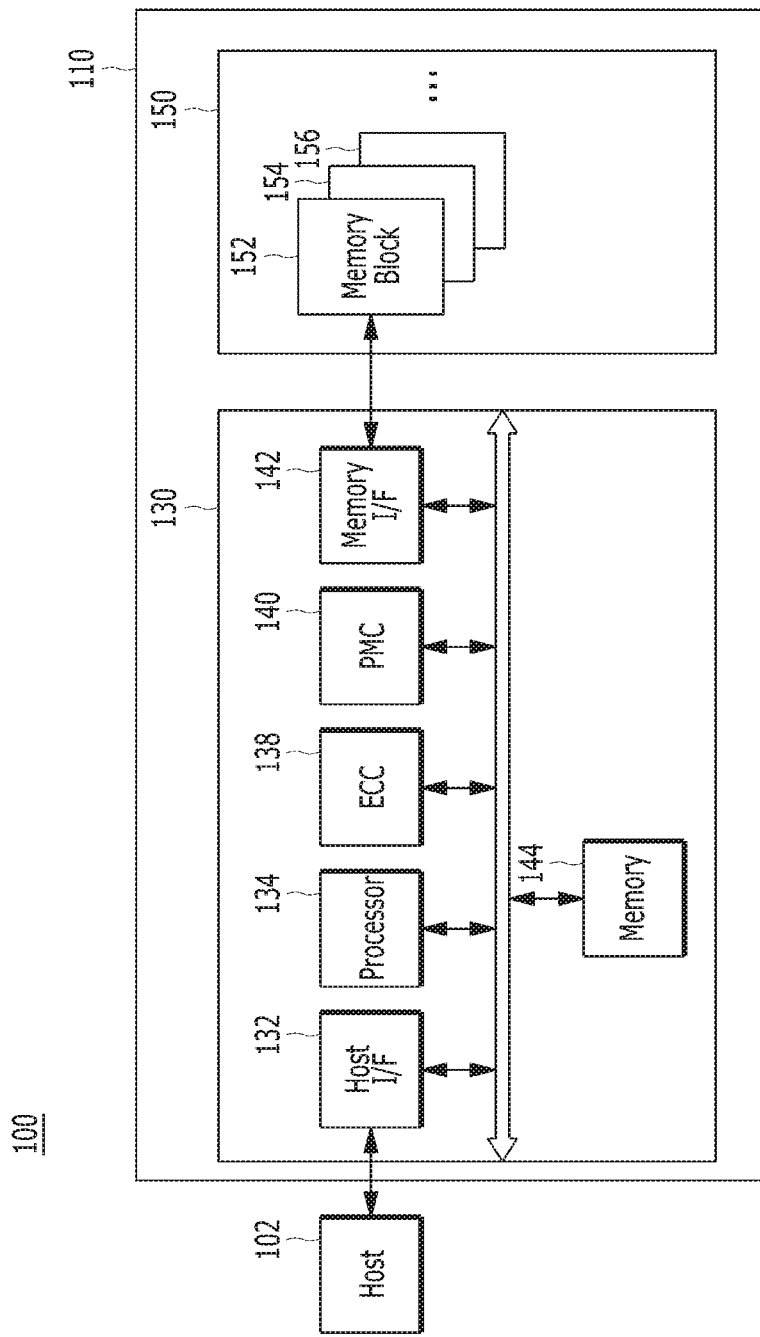
FIG. 1 is a block diagram illustrating a data processing system including a memory system in accordance with an embodiment of the present disclosure.

Various embodiments of the disclosure are described below in more detail with reference to the accompanying drawings. However, elements and features of the present disclosure may be configured or arranged differently than disclose herein. Thus, the present invention is not limited to the embodiments set forth herein. Rather, the described embodiments are provided so that this disclosure is thorough and complete and fully conveys the disclosure to those skilled in the art to which this invention pertains. Throughout the disclosure, like reference numerals refer to like parts throughout the various figures and examples of the disclosure. It is noted that reference to "an embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without departing from the spirit and scope of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via one or more intervening elements. Communication between two elements, whether directly or indirectly connected or coupled, may be wired or wireless, unless stated or the context indicates otherwise.

In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include, for example, a portable electronic device such as a mobile phone, an MP3 player and a laptop computer or an electronic device such as a desktop computer, a game player, a television (TV), a projector, or the like.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of suitable storage devices include a solid state drive (SSD), a multi-media card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such as a dynamic random access memory (DRAM) and a static RAM (SRAM) and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and/or a flash memory.

The memory system 110 may include a controller 130 and a memory device 150. The memory device 150 may store data to be accessed by the host 102, and the controller 130 may control storage of data in the memory device 150.

The controller 130 and the memory device 150 may be integrated into a single semiconductor device, which may be included in any of the various types of memory systems exemplified above.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device that retains stored data even while an electrical power is not supplied. The memory device 150 may store data provided from the host 102 through a write operation, and provide data stored therein to the host 102 through a read operation. The memory device 150 may include a plurality of memory blocks 152 to 156, each of which may include a plurality of pages. Each of the plurality of pages may include a plurality of memory cells to which a plurality of word lines (WL) are electrically coupled.

The controller 130 may control overall operations of the memory device 150, such as read, write, program and erase operations. For example, the controller 130 may control the memory device 150 in response to a request from the host 102. The controller 130 may provide the data, read from the memory device 150, with the host 102, and/or may store the data, provided by the host 102, into the memory device 150.

The controller 130 may include a host interface (I/F) 132, a processor 134, an error correction code (ECC) component 138, a power management unit (PMU) 140, a memory interface (I/F) 142, and a memory 144 all operatively coupled via an internal bus.

The host interface 132 may process commands and data provided from the host 102, and may communicate with the host 102 through at least one of various interface protocols such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI), and integrated drive electronics (IDE).

The ECC component 138 may detect and correct errors in the data read from the memory device 150 during the read operation. When the number of the error bits is greater than or equal to a threshold number of correctable error bits, the ECC component 138 may not correct error bits but instead may output an error correction fail signal indicating failure in correcting the error bits.

The ECC component 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The ECC component 138 may include suitable circuit(s), module(s), system(s) or device(s) for performing the error correction operation based on the technique used, which may include at least one of the above described codes.

The PMU 140 may provide and manage power of the controller 130.

The memory interface 142 may handle commands and data transferred between the controller 130 and the memory device 150 to allow the controller 130 to control the memory device 150 in response to a request delivered from the host 102. The memory interface 142 may generate a control signal for the memory device 150 and may process data entered into or outputted from the memory device 150 under the control of the processor 134, when the memory device 150 is a flash memory and, in particular, a NAND flash memory.

The memory 144 may serve as a working memory of the memory system 110 and the controller 130, and may store temporary or transactional data for operating or driving the memory system 110 and the controller 130. The controller 130 may control the memory device 150 in response to a request from the host 102. The controller 130 may deliver data read from the memory device 150 into the host 102, may store data entered through the host 102 within the memory device 150. The memory 144 may be used to store data required for the controller 130 and the memory device 150 in order to perform these operations.

The memory 144 may be implemented with a volatile memory such as a static random access memory (SRAM) or a dynamic random access memory (DRAM). Although FIG. 1 shows the memory 144 disposed within the controller 130, the disclosure is not limited thereto. That is, the memory 144 may be located within or externally to the controller 130. In the latter case, the memory 144 may have a memory interface for transferring data and/or signals transferred between the memory 144 and the controller 130.

The processor 134 may control the overall operations of the memory system 110. The processor 134 may drive or execute a firmware to control the overall operations of the memory system 110. The firmware may be referred to as a flash translation layer (FTL).

An FTL may operate as an interface between the host 102 and the memory device 150. The host 102 may transmit requests for write and read operations to the memory device 150 through the FTL.

The FTL may manage operations of address mapping, garbage collection, wear-leveling, and the like. Particularly, the FTL may store map data. Therefore, the controller 130 may map a logical address, which is provided from the host 102, to a physical address of the memory device 150 through the map data. The memory device 150 may perform an operation like a general device because of the address mapping operation. Also, through the address mapping operation based on the map data, when the controller 130 updates data of a particular page, the controller 130 may program new data on another empty page and may invalidate old data of the particular page due to a characteristic of a flash memory device. Further, the controller 130 may store map data of the new data into the FTL.

The processor 134 may be implemented with a microprocessor or a central processing unit (CPU). The memory system 110 may include one or more processors 134.

A management unit (not shown) may be included in the processor 134. The management unit may perform bad block management of the memory device 150. The management unit may find bad memory blocks in the memory device 150, which are in unsatisfactory condition for further use, as well as perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Bad blocks may significantly decrease the utilization efficiency of the memory device 150 having a 3D stack structure and the reliability of the memory system 100, and thus reliable bad block management is required.

Figure 2:
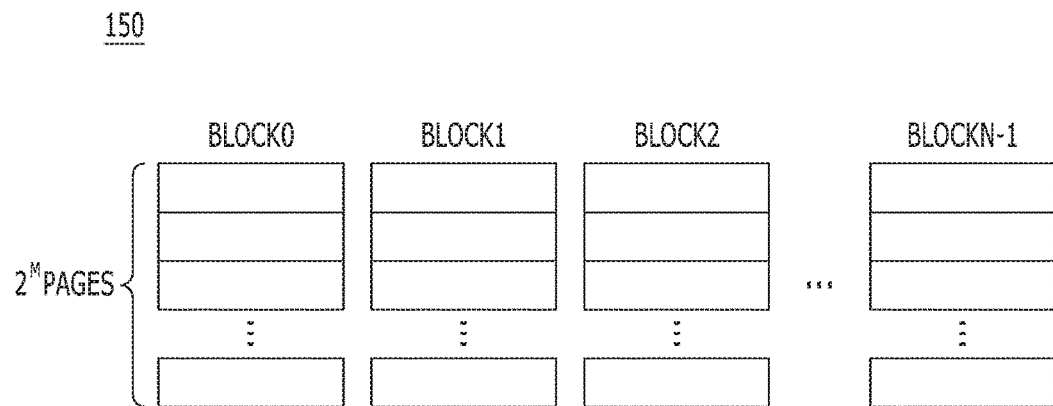
FIG. 2 is a diagram illustrating a memory device in accordance with an embodiment of the present disclosure.

FIG. 2 is a diagram illustrating a memory device, e.g., the memory device 150 of FIG. 1, in accordance with an embodiment of the present disclosure.

Referring to FIG. 2, the memory device 150 may include the plurality of memory blocks BLOCK 0 to BLOCKN-1, each of which may include a plurality of pages, for example, $2^M$ pages, the number of which may vary according to circuit design. The memory blocks of memory device 150 may be a single level cell (SLC) memory blocks and/or multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Figure 3:
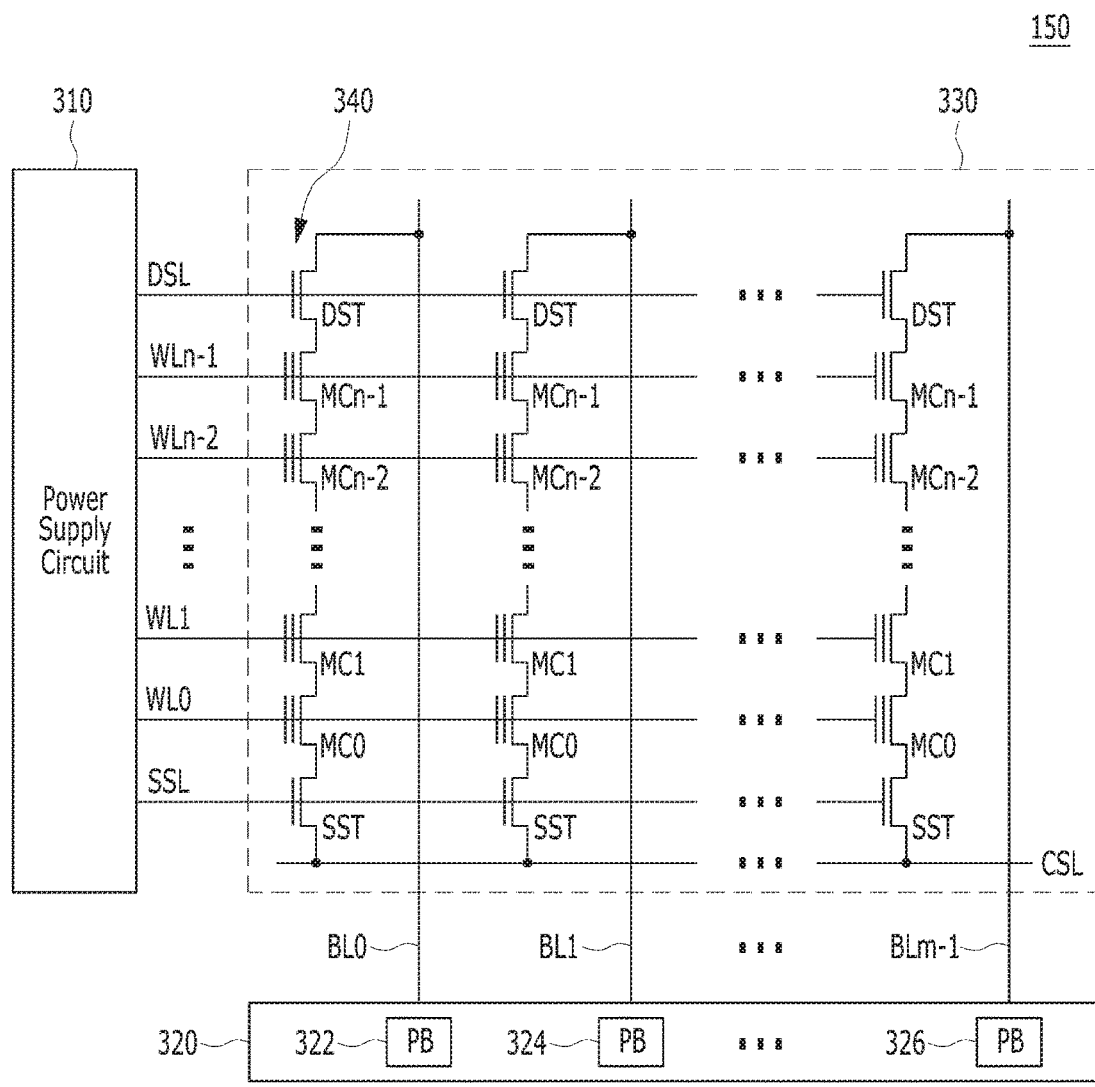
FIG. 3 is a circuit diagram illustrating a memory block in a memory device in accordance with an embodiment of the present disclosure.

FIG. 3 is a circuit diagram illustrating a memory block in accordance with an embodiment of the present disclosure, for example, a memory block 330 in the memory device 150 of FIG. 1.

Referring to FIG. 3, the memory block 330 may correspond to any of the plurality of memory blocks 152 to 156 in the memory device 150 of the memory system 110.

The memory block 330 of the memory device 150 may include a plurality of cell strings 340 which are electrically coupled to bit lines BL0 to BLm-1, respectively. The cell string 340 of each column may include at least one drain select transistor DST and at least one source select transistor SST. A plurality of memory cells or a plurality of memory cell transistors MC0 to MCn-1 may be electrically coupled in series between the select transistors DST and SST. The respective memory cells MC0 to MCn-1 may be configured as single level cells (SLC), each of which may store 1 bit of information, or as multi-level cells (MLC), each of which may store data information of a plurality of bits. The strings 340 may be electrically coupled to the corresponding bit lines BL0 to BLm-1, respectively. For reference, in FIG. 3, 'DSL' denotes a drain select line, 'SSL' denotes a source select line, and 'CSL' denotes a common source line.

While FIG. 3 only shows, as an example, that the memory block 330 is constituted with NAND flash memory cells, it is to be noted that the memory block 330 of the memory device 150 is not limited to a NAND flash memory. The memory block 330 may be realized by a NOR flash memory, a hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A power supply circuit 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The power supply circuit 310 may perform a voltage generating operation under the control of a control circuit (not shown). The power supply circuit 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read and write (read/write) circuit 320 of the memory device 150 may be controlled by the control circuit, and may serve as a sense amplifier or a write driver according to an operation mode. During a verification operation or a normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
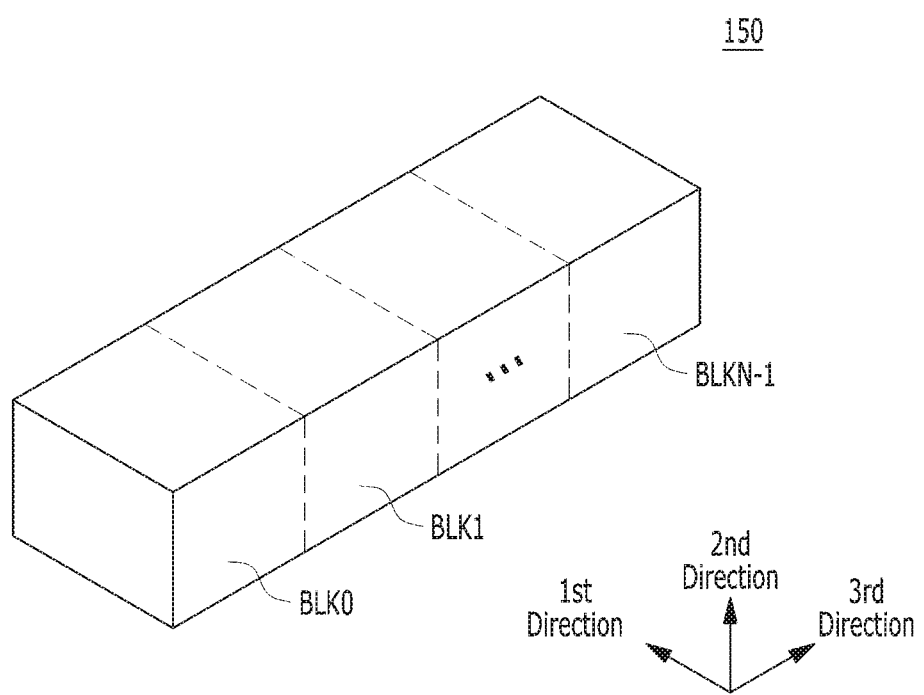
FIG. 4 is a diagram illustrating a three-dimensional structure of a memory device in accordance with an embodiment of the present disclosure.

FIG. 4 is a diagram illustrating a three-dimensional (3D) structure of a memory device in accordance with an embodiment of the present disclosure, for example, the memory device 150 of FIG. 1.

Although FIG. 4 shows a 3D structure, the memory device 150 may be embodied by a two-dimensional (2D) or three-dimensional (3D) memory device. Specifically, as illustrated in FIG. 4, the memory device 150 may be embodied in a nonvolatile memory device having a 3D stack structure. When the memory device 150 has a 3D structure, the memory device 150 may include a plurality of memory blocks BLK0 to BLKN-1 each having a 3D structure (or a vertical structure).

When power is turned off or interrupted, a volatile memory device may lose data stored therein, but a nonvolatile memory device may retain stored data in that event. Since a flash memory has high programming speed and low power consumption and can store a large amount of data, the flash memory may be widely used as a storage medium in a computer system and the like.

In the nonvolatile memory device 150, for example, the flash memory, the states of data which can be stored in its memory cells may be decided according to the numbers of bits stored in the respective memory cells. A memory cell capable of storing one-bit data may be referred to as a single-bit cell or single-level cell (SLC). A memory cell capable of storing two-bit data may be referred to as a multi-bit cell, multi-level cell (MLC) or multi-state cell. A memory cell capable of storing three-bit data may be referred to as a triple-level cell (TLC). The MLC and TLC may be suitable for high integration of the memory. However, as the number of bits programmed to one memory cell is increased, the reliability may be degraded, and the read failure rate may be increased.

For example, when k bits are to be programmed to one memory cell, any one of $2^k$ threshold voltages may be used in the memory cell. Due to a minute difference in electrical characteristic between memory cells, the threshold voltages of memory cells to which the same data are programmed may be within a range of threshold voltage distributions. The threshold voltage distributions may correspond to $2^k$ data values which can be generated by the k bits, respectively.

However, a voltage window of possible threshold voltage distributions may be limited. Therefore, as the value of k is increased, the distance between adjacent threshold voltage distributions may be reduced, and the adjacent threshold voltage distributions may overlap each other. When the adjacent threshold voltage distributions overlap each other, read data may contain many error bits (for example, several error bits or several tens of error bits).

Figure 5A:
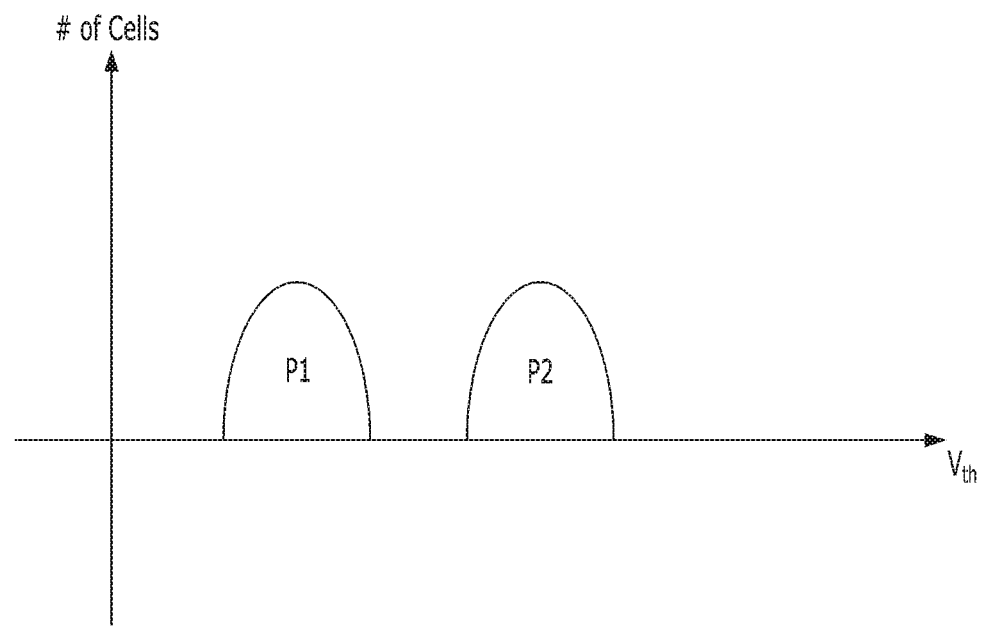
FIG. 5A is a threshold voltage distribution graph indicating an ideal program state of a memory device in accordance with an embodiment of the present disclosure.

FIG. 5A is a threshold voltage distribution graph indicating an ideal program state of a memory device in accordance with an embodiment of the present disclosure, for example, the memory device 150 of FIG. 1. In particular, FIG. 5A is a threshold voltage distribution graph illustrating a program state of the SLC nonvolatile memory device 150.

When one bit (that is, k=1) is programmed to an SLC of the nonvolatile memory device, for example, an SLC flash memory, any one of $2^1$ threshold voltage distributions, i.e., two threshold voltage distributions, may be available in the memory cell.

Due to a minute difference in electrical characteristic among a plurality of memory cells, the threshold voltages of memory cells to which the same data are programmed may be within a range of threshold voltage distributions. In the case of the SLC, there may be threshold voltage distributions P1 and P2 of two program states respectively as illustrated in FIG. 5A. In FIG. 5A illustrating the ideal threshold voltage distribution graph, neither threshold voltage distribution overlaps the other.

Figure 5B:
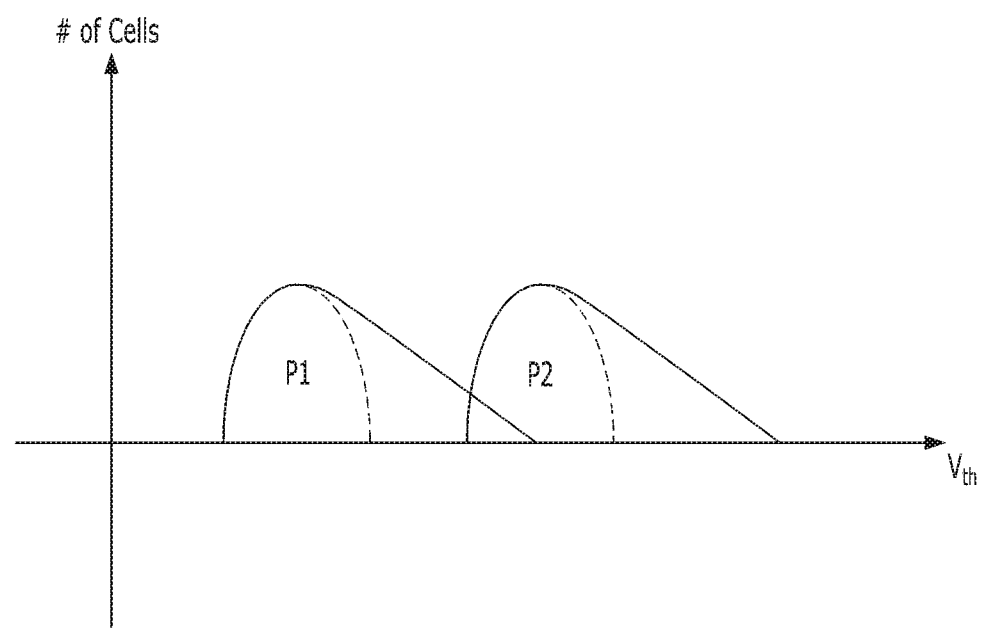
FIG. 5B is a threshold voltage distribution graph illustrating that program states may be deformed due to a physical defect of a memory device in accordance with an embodiment of the present disclosure.

FIG. 5B is a threshold voltage distribution graph illustrating that program states may be deformed due to a physical defect of a memory device in accordance with an embodiment of the present disclosure, for example, the memory device 150 of FIG. 1.

As illustrated in FIG. 5B, a progressive defect may occur due to a physical defect of the flash memory. As a result, a data loss may occur while electrons trapped in a floating gate or tunnel oxide are emitted. Furthermore, as program operations are repeated, the tunnel oxide may be deteriorated to further increase the data loss.

As the program operations are repeated, the threshold voltage distributions of the memory cells may change from the ideal threshold voltage distributions illustrated in FIG. 5A. For example, the threshold voltage distributions may change as indicated by solid lines in FIG. 5B. As illustrated in FIG. 5B, the threshold voltage distributions of the adjacent program states P1 and P2 may overlap each other. As a result, subsequently read data may contain many errors.

Therefore, the memory device 150 may detect a poorly programmed memory cell through a plurality of verify operations after programming target data, in order to prevent a data loss and the above-described error. In particular, the memory device 150 may detect data bits programmed at an excessively high threshold voltage through a program verify operation.

Figure 6:
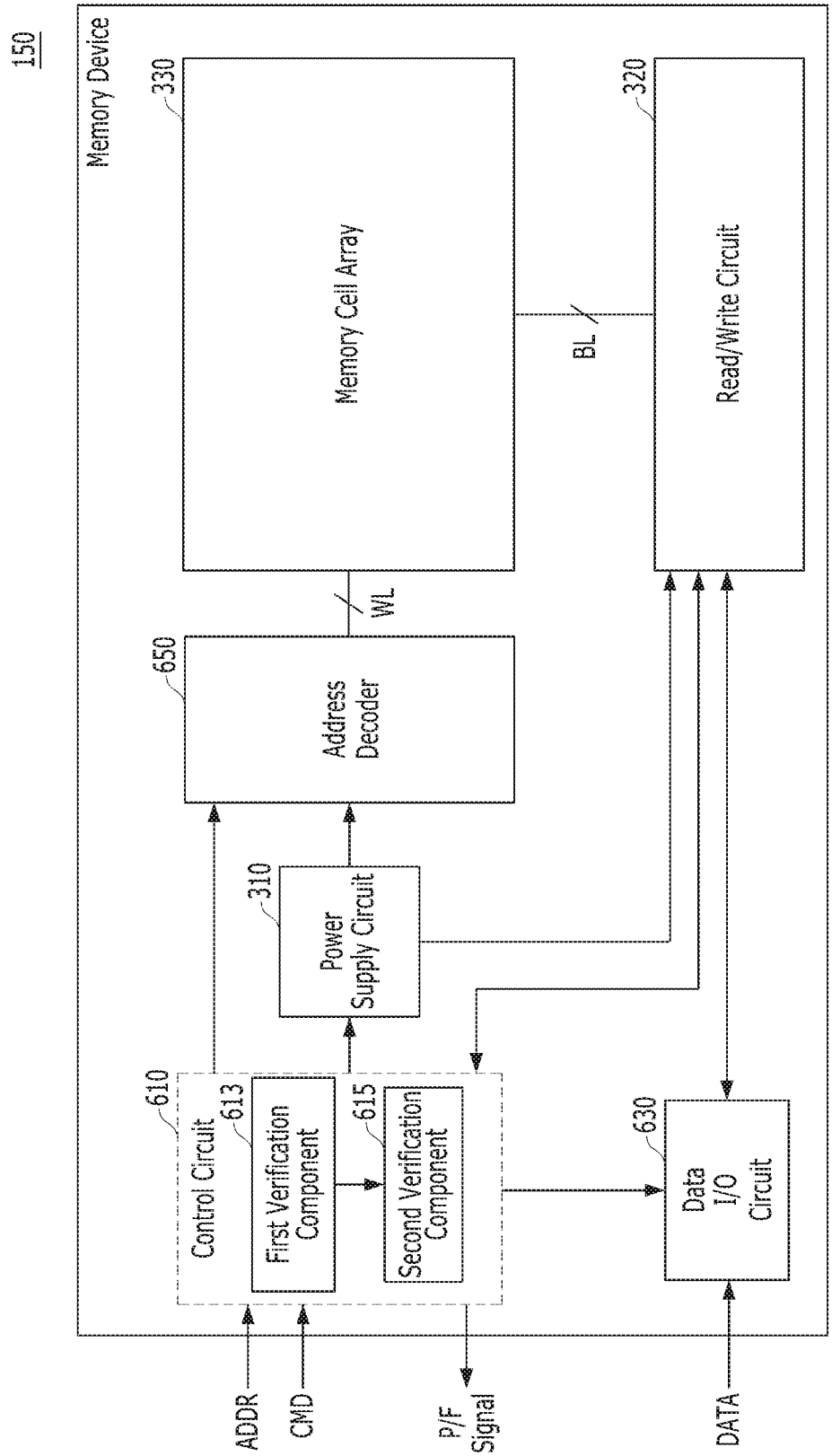
FIG. 6 illustrates a memory device in accordance with an embodiment of the present disclosure.

FIG. 6 illustrates a memory device 150 in accordance with an embodiment of the present disclosure. The following description focuses on a program operation of the memory device 150. However, as noted above, the memory device 150 can also perform a read operation.

Referring to FIG. 6, the memory device 150 may include the power supply circuit 310, the read/write circuit 320 and the memory cell array 330 as illustrated in FIG. 3, and further include a control circuit 610, an address decoder 650 and a data input/output (I/O) circuit 630.

The control circuit 610 may receive a command CMD and an address ADDR corresponding from the command CMD from the controller 130. The control circuit 610 may control the power supply circuit 310, the read/write circuit 320, the data I/O circuit 630 and the address decoder 650 according to the command CMD. For example, when the controller 130 transfers a write command from the host 102 to the memory device 150, the control circuit 610 may receive the write command and an address corresponding to the write command, and control the power supply circuit 310, the read/write circuit 320 and the address decoder 650 to program target data DATA to the memory cell array 330. The target data DATA may be transferred through the data I/O circuit 630.

The data I/O circuit 630 may receive the target data DATA to be programmed in the memory cell array 330 from the controller 130.

The address decoder 650 may be connected to the memory cell array 330 through a plurality of word lines WLs. The address decoder 650 may be operated in response to control of the control circuit 610. The address decoder 650 may receive the address ADDR from the control circuit 610. The address decoder 650 may decode the received address ADDR, and select word lines to which the target data DATA are to be programmed. Furthermore, the address decoder 650 may provide a voltage received from the power supply circuit 310 (program voltage) to the selected word lines.

For example, when a write command and an address corresponding to the write command are transferred to the memory device 150, the address decoder 650 may decode the received address, select a word line to which the target data DATA are to be programmed, and apply the program voltage received from the power supply circuit 310 to the selected word line.

As described with reference to FIG. 3, the power supply circuit 310 may apply a plurality of voltages to the respective components of the memory device 150 using an external supply voltage supplied to the memory device 150, based on control of the control circuit 610.

As described above, the read/write circuit 320 may program the target data DATA transferred from the data I/O circuit 630 to the memory cell array 330, based on control of the control circuit 610. The read/write circuit 320 may include a plurality of page buffers, which may operate in response to control of the control circuit 610, and perform data communication with the data I/O circuit 630.

Specifically, during a program operation, the plurality of page buffers may receive the target data DATA through the data I/O circuit 630. When the program voltage is applied to a selected word line, the plurality of page buffers may transfer the target data DATA to selected memory cells through a plurality of bit lines. A memory cell coupled to a bit line to which the program voltage is applied may have an increased threshold voltage. The threshold voltage of a memory cell coupled to a bit line to which a program inhibit voltage is applied may be retained.

The control circuit 610 may perform a verify operation after one or more program operations. The control circuit 610 may include first and second verification components 613 and 615 which may perform a verify operation on the program operation. Basically, during the verify operation, the address decoder 650 may apply a verification voltage received from the power supply circuit 310 to a selected word line, and apply a verification pass voltage greater than the verification voltage to unselected word lines. A specific verify operation in accordance with an embodiment will be described.

The first verification component 613, which may be implemented with suitable circuitry, may determine the number of memory cells which are programmed by an excessively high program voltage. As described above, a memory cell coupled to a bit line to which the program voltage is applied may have an increased threshold voltage. However, a memory cell having an excessively increased threshold voltage is highly likely to cause an error during a subsequent read operation for the corresponding memory cell. In order to prevent such an error, the first verification component 613 may determine the number of memory cells having an excessively increased or high threshold voltage (excessive memory cells), and determine the possibility that a program operation for a selected word line may cause an error.

Figure 7:
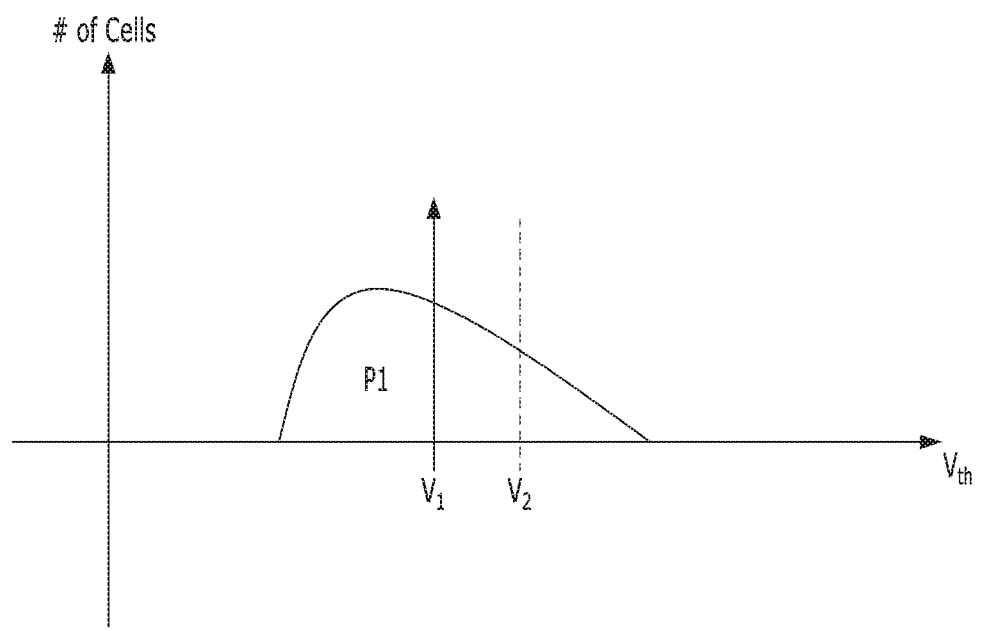
FIG. 7 illustrates a program state of a memory device in accordance with an embodiment of the present disclosure.

FIG. 7 illustrates a program state of a memory device in accordance with an embodiment of the present disclosure. Referring to FIG. 7, a program state P1 may be illustrated by the solid line), due to a physical defect of the memory device 150. In order to measure the number of excessive memory cells, the first verification component 613 of FIG. 6 may apply a verification voltage V1 to the selected word line, and measure a current flowing through a plurality of memory cells included in the selected word line. The excessive memory cell may be a memory cell having a threshold voltage greater than a reference threshold voltage V2. The reference threshold voltage V2 may be set by depending on use or application. V2, as illustrated in FIG. 7 is only an example; the present embodiment is not limited thereto.

Among the plurality of memory cells to which the verification voltage V1 is applied, the excessive memory cells may have a greater resistance value than non-excessive memory cells. As a result, current flowing through the excessive memory cells may be measured as a lower value than current flowing through the non-excessive memory cells. The first verification component 613 may identify excessive memory cells based on the measured current value, and count the number of excessive memory cells.

Referring again to FIG. 6, when the number of excessive memory cells counted by the first verification component 613 is less than an excess threshold value, the control circuit 610 may output a pass signal P to the controller 130. The pass signal P corresponds to a program operation for the selected word line.

On the other hand, when the number of excessive memory cells counted by the first verification component 613 is greater than or equal to the excess threshold value, the first verification component 613 may inform the second verification component 615 of the possibility that the program operation for the selected word line may cause an error.

The second verification component 615 may perform a secondary verify operation which is slower but more accurate than the primary verify operation of the first verification component 613, based on the error possibility received from the first verification component 613. The second verification component 615 may be implemented with suitable circuitry for carrying out its functions. Specifically, the second verification component 615 may control the read/write circuit 320 to temporarily store data programmed to the selected word line to the plurality of page buffers. The plurality of page buffers may read the programmed data from selected memory cells through bit lines BL, based on control of the second verification unit 615. The second verification component 615 may determine whether the bits of the data stored in the plurality of page buffers coincide with the bits of the target data DATA, and count the number of fail bits which do not coincide.

When the number of failed bits counted by the second verification component 615 is less than a fail threshold value, the control circuit 610 may output a pass signal P to the controller 130. The pass signal P corresponds to the program operation for the selected word line.

On the other hand, when the number of fail bits counted by the second verification component 615 is greater than or equal to the fail threshold value, the control circuit 610 may output a fail signal F to the controller 130. The fail signal F corresponds to the program operation for the selected word line.

Furthermore, the controller 130 may control the memory device 150 to program the target data DATA to another word line instead of the selected word line, in response to the fail signal.

In another embodiment, the memory device 150 may perform a verify operation using the first verification component 613, and then inform the controller 130 of the error possibility. The controller 130 may control the memory device 150 to read data programmed to a word line which is likely to have a defect, and determine a pass/fail of the program operation by comparing the read data with the target data DATA. That is, the above-described operation of the second verification component 615 may be performed by the controller 130.

Figure 8:
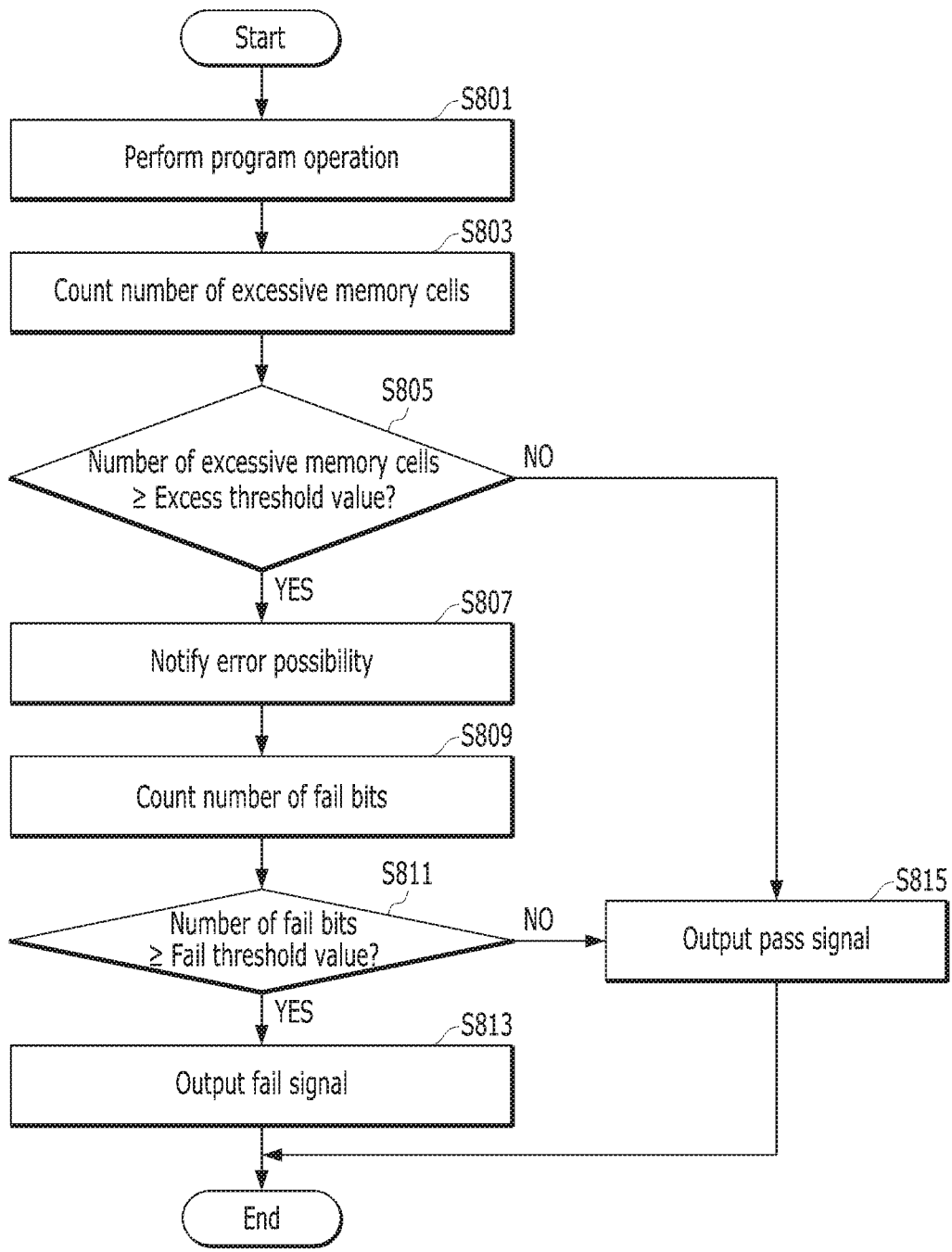
FIG. 8 is a flowchart illustrating an operation process of a memory device in accordance with an embodiment of the present disclosure.

FIG. 8 is a flowchart illustrating an operation process of a memory device, e.g., memory device 150 of FIG. 6, in accordance with an embodiment.

Referring to FIG. 8, at step S801, the control circuit 610 may control the power supply circuit 310 and the address decoder 650 to select a word line to which target data are to be programmed based on a write command received from the controller 130 and an address corresponding to the write command. Further, the control circuit 610 may control the read/write circuit 320 to program the target data to the selected word line based on the received write command and corresponding address.

After the program operation is completed, at step S803, the first verification component 613 may count the number of memory cells having an excessively increased threshold voltage, i.e. the number of excessive memory cells.

At step S805, the first verification component 613 may compare the counted number of excessive memory cells to an excess threshold value.

When the counted number of excessive memory cells is less than the excess threshold value (No at step S805), the control circuit 610 may output a pass signal P, corresponding to a program operation for the selected word line, to the controller 130 at step S815.

On the other hand, when the counted number of excessive memory cells is greater than or equal to the excess threshold value (Yes at step S805), the first verification component 613 may inform the second verification component 615 of the possibility that the program operation for the selected word line may cause an error at step S807.

At step S809, the second verification component 615 may control the read/write circuit 320 to temporarily store the data programmed to the selected word line into the plurality of page buffers. The second verification component 615 also may determine whether the bits of the temporarily stored data coincide with the bits of the target data DATA. The second verification component 615 may count the number of failed bits which do not coincide.

At step S811, the second verification component 615 may compare the counted number of failed bits to a fail threshold value.

When the number of failed bits is greater than or equal to the fail threshold value (Yes at step S811), the control circuit 610 may output a fail signal F, corresponding to the program operation for the selected word line, to the controller 130 at step S813.

On the other hand, when the number of failed bits is less than the fail threshold value (No at step S811), the control circuit 610 may output a pass signal P, corresponding to the program operation for the selected word line, to the controller 130 at step S815.

As described above, the memory device 150 and the controller 130 in accordance with embodiments detect memory cells having an excessively increased threshold voltage through the above-described method, thereby performing a finer and more accurate verify operation.

A data processing system and electronic devices which may be constituted with the memory system 110 including the memory device 150 and the controller 130, described above by referring to FIGS. 1 to 8, are described in detail below with reference to FIGS. 9 to 17.

FIGS. 9 to 17 are diagrams illustrating exemplary applications of a data processing system of FIGS. 1 to 8 according to various embodiments.

Figure 9:
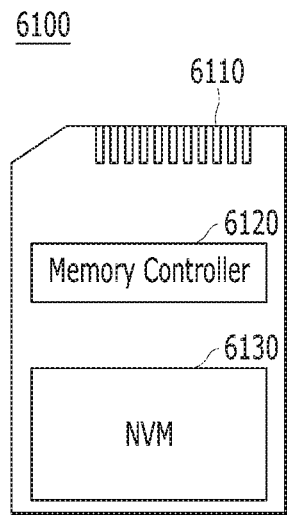
FIGS. 9 to 17 are diagrams illustrating exemplary applications of a data processing system in accordance with various embodiments of the present invention.

FIG. 9 is a diagram schematically illustrating an example of the data processing system including the memory system. FIG. 9 schematically illustrates a memory card system 6100 including the memory system in accordance with an embodiment.

Referring to FIG. 9, the memory card system 6100 may include a memory controller 6120, a memory device 6130 and a connector 6110.

More specifically, the memory controller 6120 may be connected to the memory device 6130, and may be configured to access the memory device 6130. The memory device 6130 may be embodied by a nonvolatile memory (NVM). By way of example but not limitation, the memory controller 6120 may be configured to control read, write, erase and background operations onto the memory device 6130. The memory controller 6120 may be configured to provide an interface between the memory device 6130 and a host (not shown) and/or a drive firmware for controlling the memory device 6130. That is, the memory controller 6120 may correspond to the controller 130 in the memory system 110 described with reference to FIGS. 1 to 8, while the memory device 6130 may correspond to the memory device 150 described with reference to FIGS. 1 to 8.

Thus, as shown in FIG. 1, the memory controller 6120 may include a random access memory (RAM), a processor, a host interface, a memory interface and an error correction component. The memory controller 6120 may further include other elements of the memory controller 130 described in FIG. 1.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (Wi-Fi or WiFi) and Bluetooth. Thus, the memory system and the data processing system may be applied to wired and/or wireless electronic devices, particularly mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 1.

The memory controller 6120 and the memory device 6130 may be integrated into a single semiconductor device. For example, the memory controller 6120 and the memory device 6130 may be so integrated to form a solid state driver (SSD). Also, the memory controller 6120 and the memory device 6130 may be so integrated to form a memory card such as a PC card (e.g., Personal Computer Memory Card International Association (PCMCIA)), a compact flash (CF) card, a smart media card (e.g., SM and SMC), a memory stick, a multimedia card (e.g., MMC, RS-MMC, MMCmicro and eMMC), a secured digital (SD) card (e.g., SD, miniSD, microSD and SDHC) and/or a universal flash storage (UFS).

Figure 10:
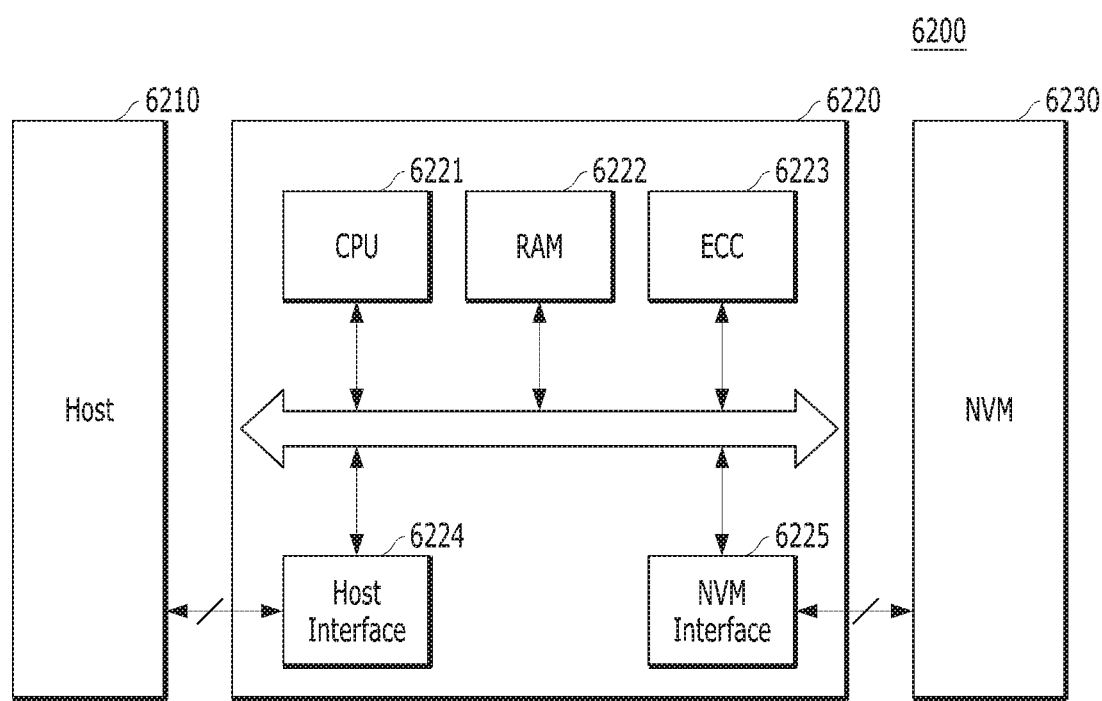

FIG. 10 is a diagram schematically illustrating another example of a data processing system 6200 including a memory system in accordance with an embodiment.

Referring to FIG. 10, the data processing system 6200 may include a memory device 6230 having one or more nonvolatile memories (NVMs) and a memory controller 6220 for controlling the memory device 6230. The data processing system 6200 may serve as a storage medium such as a memory card (e.g., CF, SD, micro-SD or the like) or USB device, as described with reference to FIG. 1. The memory device 6230 may correspond to the memory device 150 in the memory system 110 described in FIGS. 1 to 8, and the memory controller 6220 may correspond to the controller 130 in the memory system 110 described in FIGS. 1 to 8.

The memory controller 6220 may control a read, write, or erase operation on the memory device 6230 in response to a request of the host 6210, and the memory controller 6220 may include one or more central processing units (CPUs) 6221, a buffer memory such as a random access memory (RAM) 6222, an error correction code (ECC) circuit 6223, a host interface 6224 and a memory interface such as an NVM interface 6225.

The CPU 6221 may control the operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230 to operate at high speed.

The ECC circuit 6223 may correspond to the ECC component 138 of the controller 130 illustrated in FIG. 1. As described with reference to FIG. 1, the ECC circuit 6223 may generate an error correction code (ECC) for correcting a failed bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. in this case, the ECC circuit 6223 may correct an error using the parity bit. For example, as described with reference to FIG. 1, the ECC circuit 6223 may correct an error using Low Density Parity Check (LDPC) code, Bose-Chaudhri-Hocquenghem (BCH) code, turbo code, Reed-Solomon code, convolution code, Recursive Systematic Code (RSC) or coded modulation such as Trellis-Coded Modulation (TCM) or Block coded modulation (BCM).

The memory controller 6220 may transmit to, and/or receive from, the host 6210 data or signals through the host interface 6224, and may transmit to, and/or receive from, the memory device 6230 data or signals through the NVM interface 6225. The host interface 6224 may be connected to the host 6210 through a parallel advanced technology attachment (PATA) bus, a serial advanced technology attachment (SATA) bus, a small computer system interface (SCSI), an universal serial bus (USB), a peripheral component interconnect-express (PCIe), or a NAND interface. The memory controller 6220 may have a wireless communication function with a mobile communication protocol such as wireless fidelity (WiFi) or Long Term Evolution (LTE). The memory controller 6220 may be connected to an external device, e.g., the host 6210, or another external device, and then transmit and/or receive data to and/or from the external device. As the memory controller 6220 is configured to communicate with the external device through one or more of various communication protocols, the memory system and the data processing system may be applied to wired and/or wireless electronic devices, particularly a mobile electronic device.

Figure 11:
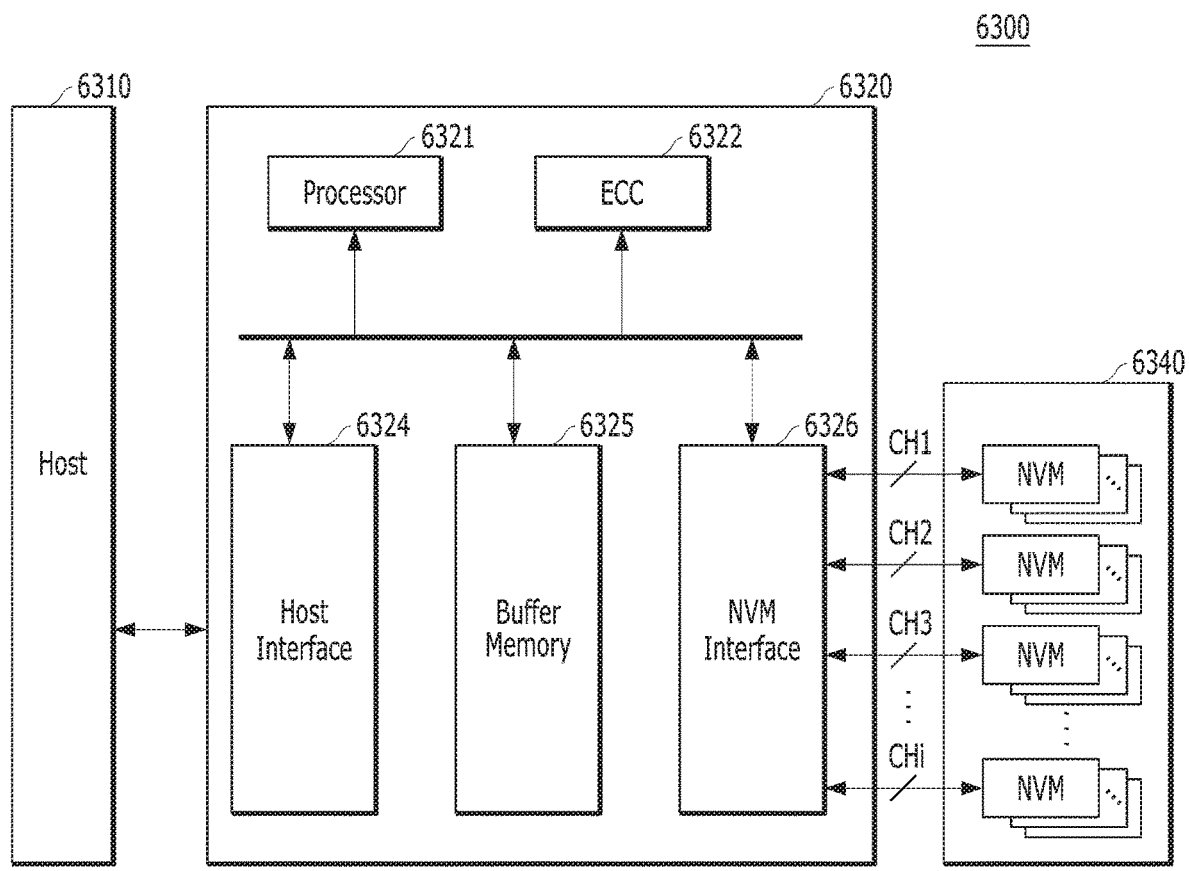

FIG. 11 is a diagram schematically illustrating another example of the data processing system including the memory system in accordance with an embodiment. FIG. 11 schematically illustrates a solid state drive (SSD) 6300 to which the memory system may be applied.

Referring to FIG. 11, the SSD 6300 may include a controller 6320 and a memory device 6340 including a plurality of nonvolatile memories (NVMs). The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by any of a variety of volatile memories such as a dynamic random access memory (DRAM), a synchronous DRAM (SDRAM), a double data rate (DDR) SDRAM, a low power DDR (LPDDR) SDRAM and a graphics RAM (GRAM) or nonvolatile memories such as a ferroelectric RAM (FRAM), a resistive RAM (RRAM or ReRAM), a spin-transfer torque magnetic RAM (STT-MRAM) and a phase-change RAM (PRAM). For the purpose of description, FIG. 11 illustrates that the buffer memory 6325 is disposed in the controller 6320, but the buffer memory 6325 may be external to the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, a redundant array of independent disks (RAID) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, i.e., RAID level information of the write command provided from the host 6310 in the SSDs 6300, and may output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 12:
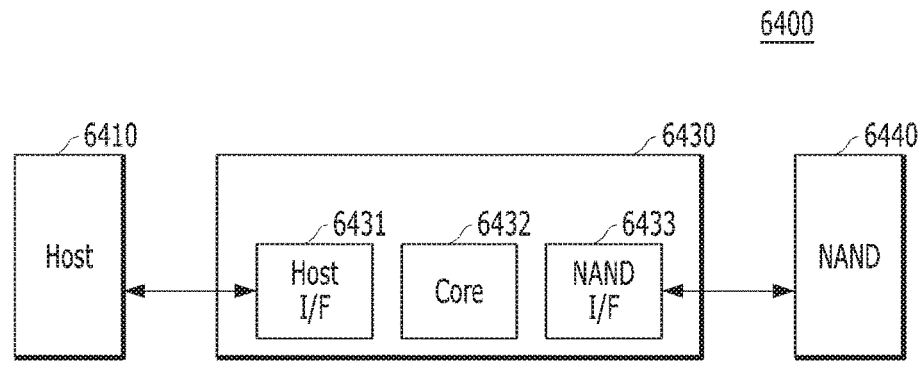

FIG. 12 is a diagram schematically illustrating another example of the data processing system including the memory system in accordance with an embodiment. FIG. 12 schematically illustrates an embedded Multi-Media Card (eMMC) 6400 to which the memory system may be applied.

Referring to FIG. 12, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface (I/F) 6431 and a memory interface, for example, a NAND interface (I/F) 6433.

The core 6432 may control the operations of the eMMC 6400, the host interface 6431 may provide an interface function between the controller 6430 and the host 6410. The NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS)-I or UHS-II interface.

FIGS. 13 to 16 are diagrams schematically illustrating other examples of the data processing system including the memory system in accordance with embodiments. FIGS. 13 to 16 schematically illustrate universal flash storage (UFS) systems to which the memory system may be applied.

Referring to FIGS. 13 to 16, the UFS systems 6500, 6600, 6700 and 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired and/or wireless electronic devices or particularly mobile electronic devices, the UFS devices 6520, 6620, 6720, 6820 may serve as embedded UFS devices. The UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700 and 6800 may communicate with external devices, e.g., wired and/or wireless electronic devices, particularly mobile electronic devices, through UFS protocols. The UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 10 to 12, and the UFS cards 6530, 6630, 6730, 6830 may be embodied in the form of the memory card system 6100 described with reference to FIG. 9.

Furthermore, in the UFS systems 6500, 6600, 6700 and 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY or MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through any of various protocols other than the UFS protocol, e.g., universal storage bus (USB) Flash Drives (UFDs), multi-media card (MMC), secure digital (SD), mini-SD, and micro-SD.

Figure 13:
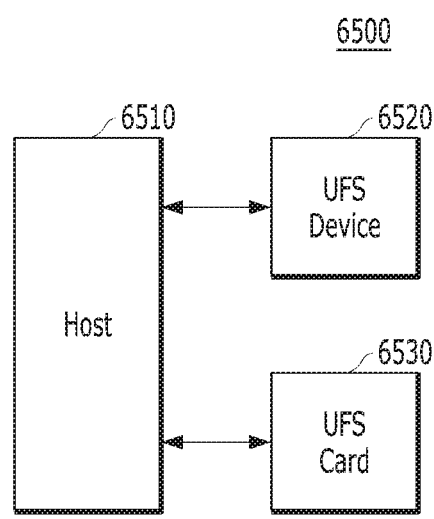

In the UFS system 6500 illustrated in FIG. 13, each of the host 6510, the UFS device 6520 and the UFS card 6530 may include UniPro. The host 6510 may perform a switching operation to communicate with at least one of the UFS device 6520 and the UFS card 6530. The host 6510 may communicate with the UFS device 6520 or the UFS card 6530 through link layer switching, e.g., L3 switching at the UniPro. In this case, the UFS device 6520 and the UFS card 6530 may communicate with each other through a link layer switching at the UniPro of the host 6510. In FIG. 13, the configuration in which one UFS device 6520 and one UFS card 6530 are connected to the host 6510 is illustrated for clarity. However, a plurality of UFS devices and UFS cards may be connected in parallel or in the form of a star to the host 6510, and a plurality of UFS cards may be connected in parallel or in the form of a star to the UFS device 6520 or connected in series or in the form of a chain to the UFS device 6520. A star forms an arrangement in which a single device is coupled with plural other devices or cards for centralized control.

Figure 14:
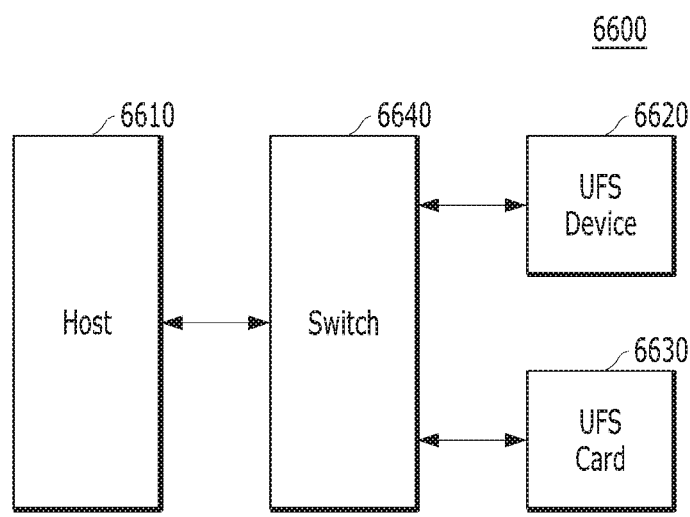

In the UFS system 6600 illustrated in FIG. 14, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In FIG. 14, the configuration in which one UFS device 6620 and one UFS card 6630 are connected to the switching module 6640 is illustrated for clarity. However, a plurality of UFS devices and UFS cards may be connected in parallel or in the form of a star to the switching module 6640, and a plurality of UFS cards may be connected in series or in the form of a chain to the UFS device 6620.

Figure 15:
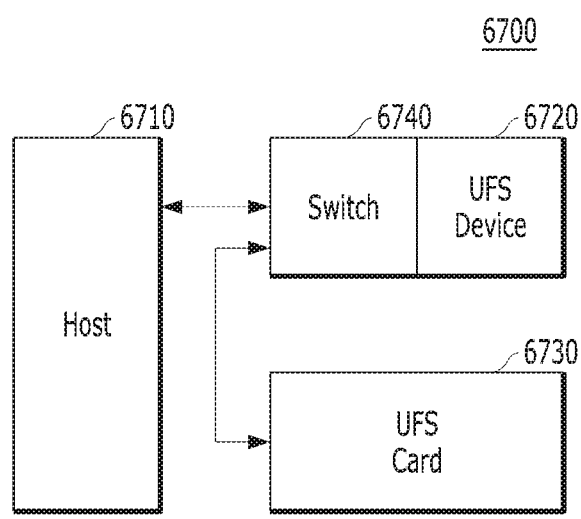

In the UFS system 6700 illustrated in FIG. 15, each of the host 6710, the UFS device 6720 and the UFS card 6730 may include UniPro. The host 6710 may communicate with the UFS device 6720 or the UFS card 6730 through a switching module 6740 performing a switching operation, for example, the switching module 6740 which performs link layer switching at the UniPro, for example, L3 switching. In this case, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In FIG. 15, the configuration in which one UFS device 6720 and one UFS card 6730 are connected to the switching module 6740 is illustrated for clarity. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 16:
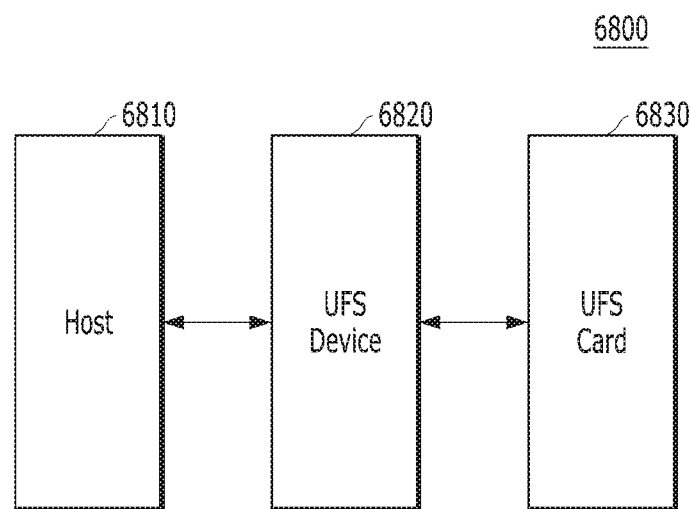

In the UFS system 6800 illustrated in FIG. 16, each of the host 6810, the UFS device 6820 and the UFS card 6830 may include M-PHY and UniPro. The UFS device 6820 may perform a switching operation to communicate with the host 6810 and the UFS card 6830. The UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target Identifier (ID) switching operation. Here, the host 6810 and the UFS card 6830 may communicate with each other through target ID switching between the M-PHY and UniPro modules of the UFS device 6820. In FIG. 16, the configuration in which one UFS device 6820 is connected to the host 6810 and one UFS card 6830 is connected to the UFS device 6820 is illustrated for clarity. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 17:
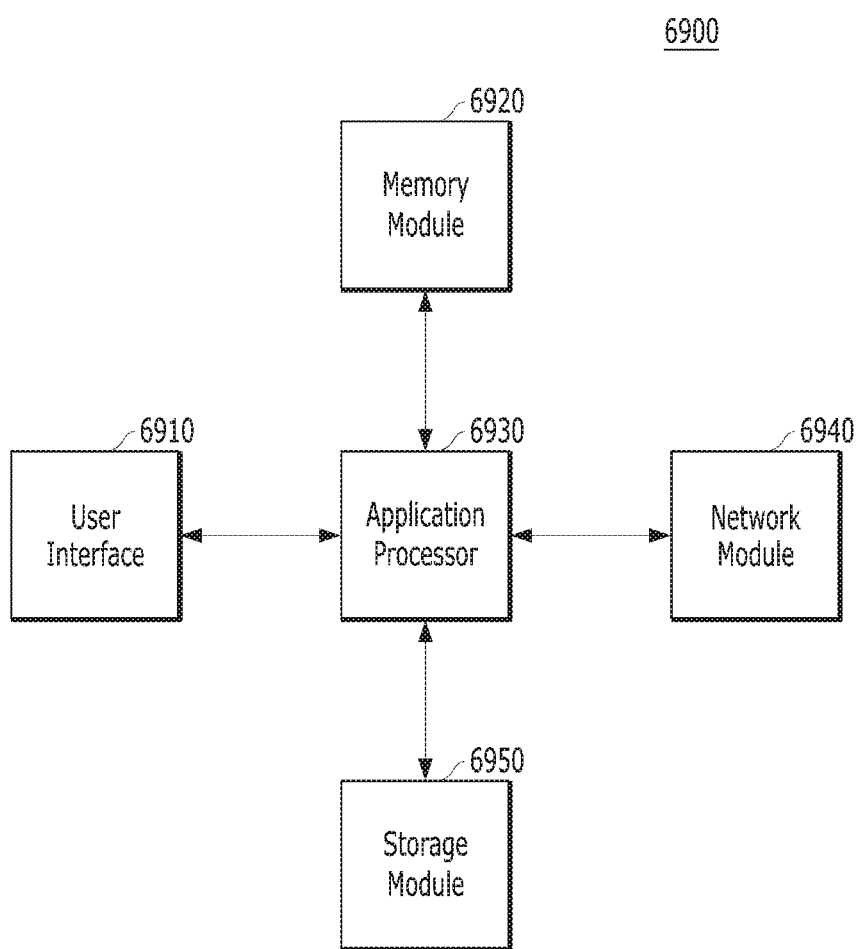

FIG. 17 is a diagram schematically illustrating another example of the data processing system including the memory system in accordance with an embodiment. FIG. 17 is a diagram schematically illustrating a user system 6900 to which the memory system may be applied.

Referring to FIG. 17, the user system 6900 may include a user interface 6910, a memory module 6920, an application processor 6930, a network module 6940, and a storage module 6950.

More specifically, the application processor 6930 may drive components included in the user system 6900, for example, an operating system (OS), and include controllers, interfaces and a graphic engine which control the components included in the user system 6900. The application processor 6930 may be provided as a System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, DDR2 SDRAM, DDR3 SDRAM, LPDDR SDARM, LPDDR3 SDRAM or LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on Package on Package (PoP).

The network module 6940 may communicate with external devices. For example, the network module 6940 may not only support wired communication, but may also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 11 to 16.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control the operations of the mobile electronic device, and the network module 6940 may serve as a communication module for controlling wired and/or wireless communication with an external device. The user interface 6910 may display data processed by the processor 6930 on a display and touch module of the mobile electronic device, or support a function of receiving data from the touch panel.

While the present invention has been illustrated and described with respect to specific embodiments, it will be apparent to those skilled in the art in light of the present disclosure that various changes and modifications may be made without departing from the spirit and scope of the invention as defined by the following claims.

What is claimed is:

1. A memory device comprising:
a memory cell array comprising a plurality of memory cells;
an address decoder suitable for selecting a word line to which target data are to be programmed based on a write command;
a read/write circuit comprising a plurality of page buffers, and suitable for performing a program operation of programming the target data to the selected word line; and
a control circuit comprising:
a first verification component suitable for counting a number of memory cells in the selected word line having a higher threshold voltage than a reference threshold voltage as excessive memory cells, after the program operation is completed; and
a second verification component suitable for:
counting a number of failed bits when the number of excessive memory cells counted is greater than or equal to an excess threshold value,
wherein the control circuit is suitable for outputting a pass or fail signal for the program operation according to the count of at least one of the first verification component and the second verification component.

2. The memory device of claim 1, wherein the first verification component counts the number of excessive memory cells by measuring current flowing through each of a plurality of memory cells in the selected word line.

3. The memory device of claim 1, wherein, when the number of excessive memory cells is greater than or equal to the excess threshold value, the first verification component triggers the second verification component.

4. The memory device of claim 1, wherein the second verification component temporarily stores the data programmed to the selected word line in the plurality of page buffers, and counts the number of failed bits by comparing bits of the data stored in the plurality of page buffers to bits of the target data.

5. The memory device of claim 1, wherein, when the number of excessive memory cells is less than the excess threshold value, the control circuit outputs the pass signal for the program operation.

6. The memory device of claim 1, wherein, when the number of failed bits is less than a fail threshold value, the control circuit outputs the pass signal for the program operation.

7. The memory device of claim 1, wherein, when the number of failed bits is greater than or equal to a fail threshold value, the control circuit outputs the fail signal for the program operation.

8. An operating method of a memory device, comprising:
- selecting a word line to which target data are to be programmed based on a write command;
- programming the target data to the selected word line;
- performing a first verify operation of counting a number of memory cells having a higher threshold voltage than a reference threshold voltage in the selected word line as excessive memory cells, after the programming of the target data;
- performing a second verify operation of counting a number of failed bits, when the number of excessive memory cells is greater than or equal to an excess threshold value; and
- outputting a pass or fail signal for the program operation, according to the result of at least one of the first verify operation and the second verify operation.

9. The operating method of claim 8, wherein the performing of the first verify operation comprises counting the number of excessive memory cells by measuring current flowing through each of a plurality of memory cells in the selected word line.

10. The operating method of claim 8, further comprising triggering a second verification component when the number of excessive memory cells is greater than or equal to the excess threshold value.

11. The operating method of claim 8, wherein the performing of the second verify operation comprises temporarily storing the data programmed to the selected word line in a plurality of page buffers, and counting the number of failed bits by comparing bits of the data stored in the plurality of page buffers to bits of the target data.

12. The operating method of claim 8, wherein the outputting of the pass or fail signal comprises outputting the pass signal for the program operation, when the number of excessive memory cells is less than the excess threshold value.

13. The operating method of claim 8, wherein the outputting of the pass or fail signal comprises outputting the pass signal for the program operation, when the number of failed bits is less than a fail threshold value.

14. The operating method of claim 9, wherein the outputting of the pass or fail signal comprises outputting the fail signal for the program operation, when the number of fail bits is greater than or equal to a fail threshold value.

15. A memory system comprising:
a memory device; and
a controller suitable for providing a write command, target data corresponding to the write command, and an address corresponding to the target data to the memory device,
wherein the memory device comprises:
a memory cell array comprising a plurality of memory cells;
an address decoder suitable for selecting a word line to which the target data are to be programmed;
a read/write circuit comprising a plurality of page buffers, and suitable for programming the target data to the selected word line; and
a control circuit suitable for:
- counting a number of memory cells having a higher threshold voltage than a reference threshold voltage as excessive memory cells in the selected word line after the program operation is completed;
- counting a number of failed bits the number of excessive memory cells counted is greater than or equal to an excess threshold value; and
- outputting a pass or fail signal for the program operation to the controller according to at least one of the number of excessive memory cells counted and the number of failed bits counted.

16. The memory system of claim 15, wherein the control circuit counts the number of excessive memory cells by measuring current flowing through each of a plurality of memory cells in the selected word line.

17. The memory system of claim 15, wherein, when the number of excessive memory cells is greater than or equal to the excess threshold value, the control circuit counts the number of failed bits.

18. The memory system of claim 15, wherein the control circuit temporarily stores the data programmed to the selected word line in the plurality of page buffers, and counts the number of failed bits by comparing bits of the data stored in the plurality of page buffers to bits of the target data.

19. The memory system of claim 15, wherein, when the number of failed bits is greater than or equal to a fail threshold value, the control circuit outputs the fail signal for the program operation to the controller.

20. The memory system of claim 19, wherein the controller controls the memory device to program the target data to another word line, instead of the selected word line, in response to the fail signal.

* * * * *